(12) United States Patent
Rivoir

(10) Patent No.: US 8,418,010 B2
(45) Date of Patent: Apr. 9, 2013

(54) FORMAT TRANSFORMATION OF TEST DATA

(75) Inventor: Jochen Rivoir, Magstadt (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 0 days.

(21) Appl. No.: 12/293,075

(22) PCT Filed: Mar. 13, 2006

(86) PCT No.: PCT/EP2006/060651
§ 371 (c)(1),
(2), (4) Date: Apr. 13, 2009

(87) PCT Pub. No.: WO2007/104355
PCT Pub. Date: Sep. 20, 2007

(65) Prior Publication Data
US 2010/0011252 A1 Jan. 14, 2010

(51) Int. Cl.
*G01R 31/3183* (2006.01)
*G01R 31/327* (2006.01)
(52) U.S. Cl. .................... 714/738; 714/702
(58) Field of Classification Search .......... None
See application file for complete search history.

(56) References Cited

U.S. PATENT DOCUMENTS

| 4,570,259 | A | * | 2/1986 | Ishii ........................ 370/458 |
| 5,644,578 | A | | 7/1997 | Ohsawa |
| 6,219,287 | B1 | * | 4/2001 | Sugiyama ................ 365/200 |
| 7,010,543 | B2 | * | 3/2006 | Pulst et al. ............... 707/102 |
| 2003/0046621 | A1 | | 3/2003 | Finkler et al. |
| 2005/0259485 | A1 | | 11/2005 | Kim |

FOREIGN PATENT DOCUMENTS

| JP | 60193056 A | * | 10/1985 |
| WO | WO 01/31356 | | 5/2001 |
| WO | WO 2007/104355 | | 9/2007 |

* cited by examiner

*Primary Examiner* — Ajay Bhatia
*Assistant Examiner* — Dipakkumar Gandhi

(57) ABSTRACT

A device for processing test data, the device having a data input interface adapted for receiving primary test data indicative of a test carried out for testing a device under test, the primary test data being provided in a primary format, a processing unit adapted for generating secondary test data in a secondary format by transforming, by carrying out a coordinate transformation, the primary test data from the primary format into the secondary format, and a data output interface adapted for providing the secondary test data in the secondary format for storing the secondary test data in a plurality of storage units.

23 Claims, 7 Drawing Sheets

FIG 6

$q(x) = x^6 + x^5 + x^3 + x^2 + 1, q = 109, x(0) = 1$ $$X = \begin{bmatrix} 1 0 0 0 0 0 1 1 1 0 0 0 0 1 0 0 1 0 0 0 1 1 0 1 1 0 0 1 0 1 1 0 1 0 1 1 \\ 0 1 1 1 0 0 0 0 1 0 0 1 0 0 0 1 1 0 1 1 0 0 1 0 1 1 0 1 0 1 1 1 0 1 1 1 \\ 0 0 1 1 1 0 0 0 0 1 0 0 1 0 0 0 1 1 0 1 1 0 0 1 0 1 1 0 1 0 1 1 1 0 1 1 \\ 0 0 0 1 1 1 0 0 0 0 1 0 0 1 0 0 0 1 1 0 1 1 0 0 1 0 1 1 0 1 0 1 1 1 0 1 \\ 0 0 0 0 1 1 1 0 0 0 0 1 0 0 1 0 0 0 1 1 0 1 1 0 0 1 0 1 1 0 1 0 1 1 1 0 \\ 0 0 0 0 0 1 1 1 0 0 0 0 1 0 0 1 0 0 0 1 1 0 1 1 0 0 1 0 1 1 0 1 0 1 1 1 \end{bmatrix}$$

APG address shown in $64^+8$ ECR memory

|    | 0   | 1   | 2   | 3   | 4   | 5   | 6   | 7   |
|----|-----|-----|-----|-----|-----|-----|-----|-----|
| 0  | 0   | 1   | 2   | 3   | 4   | 5   | 6   | 7   |
| 1  | 11  | 13  | 9   | 8   | 15  | 14  | 13  | 12  |
| 2  | 22  | 23  | 20  | 21  | 18  | 19  | 16  | 17  |
| 3  | 29  | 28  | 31  | 30  | 25  | 24  | 27  | 26  |
| 4  | 39  | 38  | 37  | 36  | 35  | 34  | 33  | 32  |
| 5  | 44  | 45  | 46  | 47  | 40  | 41  | 42  | 43  |
| 6  | 49  | 48  | 51  | 50  | 53  | 52  | 55  | 54  |
| 7  | 58  | 59  | 56  | 57  | 62  | 63  | 60  | 61  |
| 8  | 69  | 68  | 71  | 70  | 65  | 64  | 67  | 66  |
| 9  | 78  | 79  | 76  | 77  | 74  | 75  | 72  | 73  |
| 10 | 83  | 82  | 81  | 80  | 87  | 86  | 85  | 84  |
| 11 | 88  | 89  | 90  | 91  | 92  | 93  | 94  | 95  |
| 12 | 98  | 99  | 96  | 97  | 102 | 103 | 100 | 101 |
| 13 | 105 | 104 | 107 | 106 | 109 | 108 | 111 | 110 |
| 14 | 116 | 117 | 118 | 119 | 112 | 113 | 114 | 115 |
| 15 | 127 | 126 | 125 | 124 | 123 | 122 | 121 | 120 |
| 16 | 129 | 128 | 131 | 130 | 133 | 132 | 135 | 134 |
| 17 | 138 | 139 | 136 | 137 | 142 | 143 | 140 | 141 |
| 18 | 151 | 150 | 149 | 148 | 147 | 146 | 145 | 144 |
| ⋮  | ⋮   | ⋮   | ⋮   | ⋮   | ⋮   | ⋮   | ⋮   | ⋮   |

|    | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 0 | 0 | 1 | 2 | 3 | 4 | 5 | 6 | 7 | 3 | 4 | 6 | 1 | 2 | 5 | 7 | 0 | 6 | 1 | 3 | 4 | 7 | 0 | 2 | 5 | 5 | 2 | 0 | 7 | 4 | 3 | 1 | 6 |
| 1 | 0 | 2 | 5 | 4 | 7 | 0 | 3 | 6 | 7 | 0 | 2 | 5 | 6 | 1 | 3 | 4 | 5 | 2 | 0 | 7 | 4 | 3 | 1 | 6 | 6 | 1 | 3 | 4 | 7 | 0 | 2 | 5 |
| 2 | 0 | 3 | 4 | 6 | 1 | 2 | 5 | 7 | 6 | 1 | 3 | 4 | 7 | 0 | 2 | 5 | 3 | 4 | 6 | 1 | 2 | 5 | 7 | 0 | 4 | 3 | 1 | 6 | 5 | 2 | 0 | 7 |
| 3 | 0 | 4 | 3 | 1 | 6 | 5 | 2 | 0 | 1 | 6 | 4 | 3 | 0 | 7 | 5 | 2 | 4 | 3 | 1 | 6 | 5 | 2 | 0 | 7 | 7 | 0 | 2 | 5 | 6 | 1 | 3 | 4 |
| 4 | 0 | 5 | 7 | 0 | 2 | 3 | 4 | 6 | 2 | 5 | 7 | 0 | 3 | 4 | 6 | 1 | 7 | 0 | 2 | 5 | 6 | 1 | 3 | 4 | 1 | 6 | 4 | 3 | 0 | 7 | 5 | 2 |
| 5 | 0 | 6 | 1 | 3 | 0 | 7 | 5 | 2 | 5 | 2 | 0 | 7 | 4 | 3 | 1 | 6 | 0 | 7 | 5 | 2 | 1 | 6 | 4 | 3 | 3 | 4 | 6 | 1 | 2 | 5 | 7 | 0 |
| 6 | 0 | 7 | 6 | 2 | 5 | 3 | 4 | 1 | 4 | 3 | 1 | 6 | 5 | 2 | 0 | 7 | 2 | 5 | 7 | 0 | 3 | 4 | 6 | 1 | 2 | 5 | 7 | 0 | 3 | 4 | 6 | 1 |
| 7 | 0 | 3 | 7 | 5 | 6 | 2 | 1 | 4 | 0 | 7 | 5 | 2 | 1 | 6 | 4 | 3 | 1 | 6 | 4 | 3 | 0 | 7 | 5 | 2 | 0 | 7 | 5 | 2 | 1 | 6 | 4 | 3 |
| 8 | 2 | 5 | 7 | 0 | 3 | 4 | 6 | 1 | 1 | 6 | 4 | 3 | 0 | 7 | 5 | 2 | 4 | 3 | 1 | 6 | 5 | 2 | 0 | 7 | 7 | 0 | 2 | 5 | 6 | 1 | 3 | 4 |
| 9 | 3 | 4 | 6 | 1 | 2 | 5 | 7 | 0 | 3 | 4 | 6 | 1 | 2 | 5 | 7 | 0 | 6 | 1 | 3 | 4 | 7 | 0 | 2 | 5 | 0 | 7 | 5 | 2 | 1 | 6 | 4 | 3 |
| 10 | 5 | 2 | 0 | 7 | 4 | 3 | 1 | 6 | 2 | 5 | 7 | 0 | 3 | 4 | 6 | 1 | 7 | 0 | 2 | 5 | 6 | 1 | 3 | 4 | 5 | 2 | 0 | 7 | 4 | 3 | 1 | 6 |
| 11 | 7 | 0 | 3 | 4 | 6 | 1 | 2 | 5 | 5 | 2 | 7 | 0 | 3 | 4 | 6 | 1 | 2 | 5 | 7 | 0 | 3 | 4 | 6 | 1 | 2 | 5 | 7 | 0 | 3 | 4 | 6 | 1 |
| 12 | 3 | 4 | 6 | 1 | 2 | 5 | 7 | 0 | 6 | 1 | 3 | 4 | 7 | 0 | 2 | 5 | 1 | 6 | 4 | 3 | 0 | 7 | 5 | 2 | 4 | 3 | 0 | 7 | 5 | 2 | 1 | 6 |
| 13 | 4 | 3 | 1 | 6 | 5 | 2 | 0 | 7 | 5 | 2 | 0 | 7 | 4 | 3 | 1 | 6 | 0 | 7 | 5 | 2 | 1 | 6 | 4 | 3 | 6 | 1 | 3 | 4 | 7 | 0 | 2 | 5 |
| 14 | 6 | 1 | 3 | 4 | 7 | 0 | 2 | 5 | 7 | 0 | 2 | 5 | 6 | 1 | 3 | 4 | 3 | 4 | 6 | 1 | 2 | 5 | 7 | 0 | 4 | 3 | 1 | 6 | 5 | 2 | 0 | 7 |
| 15 | 1 | 6 | 4 | 3 | 0 | 7 | 5 | 2 | 2 | 5 | 7 | 0 | 3 | 4 | 6 | 1 | 5 | 2 | 0 | 7 | 4 | 3 | 1 | 6 | 3 | 4 | 6 | 1 | 2 | 5 | 7 | 0 |

$q(x) = x^3 + x^2 + 1, \; q = 11$ $$X = \begin{bmatrix} 1 & 0 & 0 & 1 & 0 & 1 & 1 & 1 & 0 \\ 0 & 1 & 0 & 1 & 1 & 1 & 0 & 0 & 1 \\ 0 & 0 & 1 & 0 & 1 & 1 & 1 & 0 & 0 \end{bmatrix}$$

FIG 9

|   | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|----|----|----|----|----|----|----|----|----|----|----|----|----|----|----|----|----|----|----|----|----|----|
| 0 | O |   |   |   |   |   |   |   |   |   |    |    |    |    |    |    |    |    |    |    |    |    |    |    |    |    |    |    |    |    |    |    |
| 1 |   |   |   |   | O |   |   |   |   |   |    |    |    |    |    |    |    |    |    |    |    |    |    |    |    |    |    |    |    |    |    | O |
| 2 |   |   | O |   |   |   |   |   |   |   |    |    |    |    |    |    |    |    |    |    |    |    |    |    |    |    | O |    |    |    |    |    |
| 3 |   |   |   |   |   |   | O |   |   |   |    |    |    |    |    |    |    |    |    |    |    |    |    |    |    |    |    |    |    |    | O |    |
| 4 |   |   |   |   |   |   |   |   |   |   |    |    |    |    |    |    |    |    |    |    |    |    |    |    |    |    |    |    | O |    |    |    |
| 5 |   |   |   |   |   | O |   |   |   |   |    |    |    |    |    |    |    |    |    |    |    |    |    |    |    |    |    | O |    |    |    |    |
| 6 |   |   |   |   |   |   |   |   |   |   |    |    |    |    |    |    |    |    |    |    |    |    | O |    |    |    |    |    |    |    |    |    |
| 7 |   |   |   | O |   |   |   |   |   |   |    |    |    |    |    |    |    |    |    |    |    |    |    | O |    |    |    |    |    |    |    |    |
| 8 |   |   |   |   |   |   |   |   |   |   |    |    |    |    |    |    |    |    |    |    |    |    |    |    | O |    |    |    |    |    |    |    |
| 9 |   |   |   |   |   |   |   |   |   | O |    |    |    |    |    |    |    |    |    |    |    |    |    |    |    |    |    |    |    |    |    |    |
| 10|   | O |   |   |   |   |   |   |   |   |    |    |    |    |    |    |    |    |    |    |    |    |    |    |    |    |    |    |    | O |    |    |
| 11|   |   |   |   |   |   |   |   |   |   |    |    | O |    |    |    |    |    |    |    |    | O |    |    |    |    |    |    |    |    |    |    |
| 12|   |   |   |   |   |   |   |   |   |   |    |    |    |    |    |    |    |    |    |    |    |    |    |    |    |    |    | O |    |    |    |    |
| 13|   |   |   |   |   |   |   |   |   |   |    |    |    |    |    |    |    |    |    |    |    |    |    |    |    | O |    |    |    |    |    |    |
| 14|   |   |   |   |   |   |   |   |   |   |    |    |    |    | O |    |    |    |    |    |    |    |    |    |    |    |    |    |    |    |    |    |
| 15|   |   |   |   |   |   |   | O |   |   |    |    |    |    |    |    |    |    |    |    |    |    |    | O |    |    |    |    |    |    |    |    |

900

FORMAT TRANSFORMATION OF TEST DATA

TECHNICAL FIELD

The present invention relates to processing of test data acquired during a test of a device under test.

BACKGROUND

For testing electronic devices, in particular integrated electronic circuits like memory devices (particularly DRAMs) providing digital electrical output signals, a test or stimulus signal is fed to an input of the device under test, and a response signal of the device under test is evaluated by an automatic test equipment, for example by comparison with expected data. Such an automatic test equipment may have included a particular test functionality, that is to say test functions or routines which the test equipment may carry out. This test functionality may be incorporated in the test equipment in the form of executable software code.

As a result of a test of a memory device like a DRAM array, a pass/fail information is assigned to each memory cell being tested indicating whether the individual memory cell has passed the test successfully or not. Storing and rapidly managing a huge amount of such test result data is a demanding challenge for a test equipment and a test result data processing unit.

SUMMARY

According to an embodiment, a device for processing test data may have: a data input interface adapted for receiving primary test data indicative of a test carried out for testing a device under test, the primary test data being provided in a primary format; a processing unit adapted for generating secondary test data in a secondary format by transforming, by carrying out a coordinate transformation, the primary test data from the primary format into the secondary format by carrying out a transformation of the primary test data from a first coordinate system formed by one or more first coordinates into a second coordinate system formed by one or more second coordinates, the first coordinates differing from the second coordinates; a data output interface adapted for providing the secondary test data in the secondary format for storing the secondary test data in a plurality of storage units.

According to another embodiment, a test apparatus may have: a test unit adapted for carrying out a test for testing a device under test and for generating primary test data indicative of the test; a device for processing test data, which may have: a data input interface adapted for receiving primary test data indicative of a test carried out for testing a device under test, the primary test data being provided in a primary format; a processing unit adapted for generating secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates; a data output interface adapted for providing the secondary test data in the secondary format for storing the secondary test data in a plurality of storage units, for processing the generated primary test data.

According to another embodiment, a method of processing test data may have the steps of: receiving primary test data indicative of a test carried out for testing a device under test, the primary test data being provided in a primary format; generating secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates; providing the secondary test data in the secondary format for storing the secondary test data in a plurality of storage units.

An embodiment may have: a computer-readable medium, in which a computer program of processing test data is stored, which computer program, when being executed by a processor, is adapted to control or carry out a method of receiving primary test data indicative of a test carried out for testing a device under test, the primary test data being provided in a primary format; generating secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates; providing the secondary test data in the secondary format for storing the secondary test data in a plurality of storage units.

An embodiment may have: a program element of processing test data, which program element, when being executed by a processor, is adapted to control or carry out a method of receiving primary test data indicative of a test carried out for testing a device under test, the primary test data being provided in a primary format; generating secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates; providing the secondary test data in the secondary format for storing the secondary test data in a plurality of storage units.

Embodiments of the invention can be partly or entirely embodied or supported by one or more suitable software programs, which can be stored on or otherwise provided by any kind of data carrier, and which might be executed in or by any suitable data processing unit. Software programs or routines can be advantageously applied for test signal processing. The test data conversion scheme according to an embodiment of the invention can be performed by a computer program, i.e. by software, or by using one or more special electronic optimization circuits, i.e. in hardware, or in hybrid form, i.e. by means of software components and hardware components.

The term "coordinate transformation" may particularly denote a transformation of data from a first coordinate system formed by one or more first coordinates into a second coordinate system formed by one or more second coordinates, the first coordinates differing from the second coordinates. Such a coordinate transformation may include describing data with different coordinates as compared to the data description in the original coordinate system. Thus, a coordinate transformation does not only include a mere rearrangement or reordering of data to be described in a modified order, but includes a modification of the coordinates according to which a data structure is arranged. For instance, data arranged in a first coordinate system defined by rows and columns are translated into a coordinate system formed by a number indicative of a region within this space and formed by a number indicative of a position with this region.

A sequential processing of data items does not fall under this definition of a coordinate transformation, because it merely makes a selection of a memory dependent on an independent variable (counter value) that is not part of the primary data.

According to an exemplary embodiment, test data being indicative of a result of a test of testing a device under test are modified in a sophisticated manner for an efficient storage, post-processing, management and access of such test result data. For instance, a matrix-like arrangement of memory cells in a storage device may be tested, and particular test sequences may be performed with these memory cells. For instance, these cells may be tested individually, may be programmed, erased, programmed again, read out, may be tested row-wise, column-wise or along a diagonal of a matrix-like array of the memory cells.

Thus, quite complex structured test results need to be stored in one or a plurality of test result memories. As will be described below in more detail, partitioning a memory into a plurality of memory portions and performing a format/coordinate transformation of the test result data may allow for a resource efficient and time efficient storage of the test results in the different memory partitions in such a manner that items of the test data may be retrieved in the partitioned memory in an easy and unambiguous manner and in such a manner that test result storage capacities are managed and used efficiently. Thus, carrying out a smart coordinate transformation or format transformation may allow for a quick, reliable and memory efficient test of electronic devices under test, particular memory devices.

When testing memory or storage products, it is a tendency that the storage capacity of such memory products (like DRAMS) increases significantly, and the speed of such memories increases as well. For a reliable test of the functionality of such a storage product, it is usually desirable to allow for a test of the memory product with essentially the same speed with which the memory product is used during normal operation (for instance to detect so-called "speed-dependent defects" during the test).

A DRAM memory, for instance, may be a matrix-like arrangement of memory cells in which the individual memory cells are arranged along rows and columns. The rows are addressed or controlled by one or more row addressing decoders, and the columns are addressed or controlled by one or more column address decoders. For testing whether individual DRAM cells work properly or not, it is in many cases not sufficient to individually program data in a memory cell and read out the data afterwards, but in order to detect defects resulting from an interaction between adjacent memory cells, row-like, column-like and diagonal-like test sequences may be carried out. Furthermore, extra memory cells may be provided in a DRAM for substituting the function of DRAM cells in the matrix array which turn out to be defective during the test. Such a complicated memory arrangement, particularly in a scenario in which speed dependent defects shall be detected as well, necessitates a sophisticated test architecture.

For such a test, the memory cells may be tested individually or groupwise, and corresponding pass/fail bits may be stored in an error cell map. From such a map, the information may be derived which of the memory cells have passed and which of the memory cells have failed the test.

According to an exemplary embodiment, a transfer scheme of pass/fail data from, for instance, a matrix-like arrangement in a device under test to the error cell map is performed.

Thus, a table-like storage structure (ECR, Error Catch RAM) may be provided from which the information may be taken which of the portions of the device under test have passed and which have failed the test. This can be taken as a basis for evaluating whether the entire device under test has passed or has failed the test, and how defective portions of the device under test may be repaired (for instance using redundant memory structures).

Since memory devices or other electronic products as devices under test become increasingly fast in operation, the test patterns should be fast as well. Accordingly, the ECR storage scheme should be fast, advantageously at least as fast as the device under test. However, since currently developed memory devices have to be tested based on already existing memory devices (being constructed in many cases according to an earlier technology generation), the problem may arise to test fast devices with slower test result storage units. This may involve bandwidth problems resulting from a comparison of the performance of the ECR memory and a DUT memory.

A straightforward approach would be to use a plurality of memories for the ECR in order to increase the bandwidth of the test result storage memory by a factor which is dependent on the number of the test result storage memories. Then, in a round-robin manner, test result data may be stored in the various memories, for instance using a demultiplexer. However, with increasing demands of storage capacity and speed of memory products to be tested, the dimension and number of test result storage memories increases which may make the test equipment large dimensioned and expensive. Furthermore, the periphery of such a system may become very complex. Such a straightforward approach may also have the disadvantage that in each of the memories the test result data are stored in a redundant fashion.

In contrast to this, according to an exemplary embodiment, one memory or a plurality of memories is or are used in combination with a data format transformation scheme for converting between primary test data originating from the device under test and secondary test data brought in a format in which the test results are stored in an ECR. This may make it possible that the dimension of the storage unit for storing the test results in the modified format is not (much) larger than the memory of the device under test. Furthermore, such an embodiment may allow to have a high bandwidth.

Such a coordinate transformation may be performed so that a plurality of physical memories or a plurality of partitions of one physical memory are logically connected to one another, that is to say are linked in a non-overlapping or unique manner. Thus, an intelligent mapping between the initial raw test result data and test result data made fit for efficient storage may be performed.

Such a format transformation may distribute the addresses so that the DUT addresses are mapped to ECR addresses in such a manner that all relevant/occurring test data (in accordance with a test pattern) are distributed (particularly mapped essentially equally often) in each of the memory unit portions, wherein ECR addresses of different memory portions are correlated. This may ensure that, at least in the long run or on the average, each of the memory unit portions is essentially equally often used, which may allow for an efficient handling of the storage capacity of the storage unit for storing the modified test results.

According to an exemplary embodiment, the coordinate transformation may be such that a secondary test data sequence is conflict-free with a finite buffer for an interesting set of primary test data sequences.

Next, further exemplary embodiments of the invention will be explained. In the following, further exemplary embodiments of the device for processing test data will be explained. However, these embodiments also apply for the test apparatus, for the method of processing test data, for the program element and for the computer-readable medium.

The data input interface may be adapted for receiving the primary test data in the primary format being indicative of an address of a tested portion of the device under test and being indicative of a test result of the tested portion of the device under test. Thus, each of the primary test data items may include the information which portion of the device under test (for instance which memory cell of a DRAM) has been tested and what the result this test particularly was (particularly whether the tested portion of the device under test has passed the test or has failed the test).

The address may be indicative of a row and a column of the tested portion of the device under test. With such a test result management, a matrix-like arrangement of memory cells in a memory under test, like in a DRAM or in an EEPROM, may be reflected.

The test result may be indicative of whether the tested portion of the device under test has passed the test or has failed the test. The determination or decision whether the tested portion has passed or failed the test may be taken based on a comparison of response data in response to the application of a stimulus signal to the tested portion with expected data. In case that the actual test result is in proper accordance with the expected test result, it may be assumed that the tested portion has passed the test, otherwise it may be assumed that the tested portion has failed the test.

The data output interface may be adapted for providing the secondary test data in the secondary format being indicative of an address of the storage unit in which the test result of the tested portion of the device under test is to be stored and being indicative of a test result of the tested portion of the device under test. Thus, also the secondary test data may include all information for judging a functionality or performance of the tested portion. However, the secondary test data have been converted into a format which allows a more efficient storage and handling of the complex test data stored in the memory unit.

Particularly, the address may be indicative of a partition of the storage unit in which partition the test result of the tested portion of the device under test is to be stored and may be indicative of an address within the partition of the storage unit in which partition the test result of the tested portion of the device under test is to be stored. Thus, particularly, a row—column—pass/fail information structure as the primary test data format may be converted into a partition number—address in corresponding partition—pass/fail information structure as the secondary test data format so that an unambiguous assignment of the test data stored in the original and in the modified format may be performed.

The test result may be indicative of whether the tested portion of the device under test has passed the test or has failed the test. This may be encoded in a test result bit which may have a logical value "1" (i.e. test passed) or which may have a logical value "0" (i.e. test failed), or vice versa.

The processing unit may be adapted in such a manner that the primary format is different from the secondary format. Thus, a real coordinate transformation or format transformation may be performed so as to efficiently use test result memory resources for storing the test data.

The processing unit may be adapted in such a manner that the secondary format is obtained from a coordinate transformation of the primary format. Particularly, row-column coordinates of a matrix-like memory device under test may be transferred into a coordinate system which indicates the number of a partition and an address within such a partition.

The processing unit may further be adapted in such a manner that the primary test data is mapped into the secondary test data in such a manner that items of the secondary test data are, on the average, distributed essentially equally often to different partitions of the storage unit. Therefore, it may be ensured that the storage capacity and thus the resources of the individual partitions of the memory unit are used efficiently, so that essentially no memory storage capacity of the memory unit remains unused.

The processing unit may be adapted to map the primary test data into the secondary test data in a bijective manner. In mathematical language, injection, surjection and bijection may denote classes of functions distinguished by the manner in which arguments and images are mapped. An injection does not map two distinct arguments to the same image (output value), but does not necessarily reach all possible output values. A surjection maps at least one input to any possible image. A bijection is a function that is both injective and surjective. A bijective function may be also denoted as a one-one correspondence. Such a bijective test result data management allows to easily retrieve items of the test data without leaving memory capacity unused.

The processing unit may be adapted for generating intermediate test data in an intermediate format by transforming the primary test data from the primary format into the intermediate format and may be adapted for generating the secondary test data in the secondary format by transforming the intermediate test data from the intermediate format into the secondary format. In other words, the transfer of the coordinates from the first format into the second format may be performed in two (or more) steps, which may simplify the numerical effort necessitated for such a transfer.

The processing unit may be adapted to map the primary test data into the secondary test data using at least one of the group consisting of a skewed Latin square, a scrambled Latin square, interleaved scrambling, interleaved polynomial scrambling, skewed interleaved scrambling, skewed interleaved polynomial scrambling, and a combination thereof. Such processing schemes may be applied advantageously for the format transfer according to an exemplary embodiment. These schemes will be explained below in more detail.

In the following, further exemplary embodiments of the test apparatus will be explained. However, these embodiments also apply for the device for processing test data, for the method of processing test data, for the program element and for the computer-readable medium.

The architecture of such a test apparatus may comprise a central control unit, like a workstation, and a connected test device. Further, one or a plurality of devices under test (DUT) may be connected to such a test device for being tested. Particularly, the DUT may comprise a plurality of pins which are connected via connection elements to the test device. Then, under the control of the control unit, the test unit may apply stimulus signals to the devices under test (sequentially or simultaneously). At special pins, response signals are provided by the devices under test. Such response signals may be compared to expected response signals, and a comparison between the response signals and the expected signals may yield the result whether an individual portion of an individual device under test has passed or failed the test. Such data may then be converted in the test device and the workstation into a format in which it may be efficiently stored as an ECR.

The test apparatus may particularly be adapted as a memory test device for testing a memory device under test. Such a tested memory device product may be a DRAM, an EEPROM or a flash memory cell. Alternatively, such a device under test may be a logic device, an electric circuit, an integrated circuit, a processor, a system-on-chip, or a hybrid circuit. However, in principle any electronic product may be tested by the data processing system according to an exemplary embodiment of the invention.

The test apparatus may further comprise a storage unit coupled to the data output interface which is adapted for storing the secondary test data in the secondary format. Thus, the ECR may be stored in this storage unit, so that an efficient management of the storage capacity of the storage unit may be made possible to keep the efforts necessitated for designing the storage unit as small as possible. This may be efficiently assisted by the coordinate transformation functionality of embodiments of the invention.

The storage unit may be divided into a plurality of partitions, wherein each of the plurality of partitions may be adapted for storing the secondary test data in the secondary format. By partitioning the storage unit, a high bandwidth may be obtained, and by efficiently managing the distribution of test result data to be stored in the plurality of partitions, this high bandwidth can be combined with a high data management velocity, and thus with a high test speed.

The plurality of partitions may be physically separate entities and/or portions of the physical storage unit. In other words, the different partitions may be provided as physically separate units or devices which are connected only logically, since the address management of the individual partitions may be controlled or regulated centrally. Alternatively, the plurality partitions may simply be logically distinguished portions of one and the same storage unit, wherein only the storage management of the individual partitions is performed in such a manner that the different partitions may be logically distinguished.

The test apparatus may comprise one or a plurality of buffer units (like a FIFO) which may be arranged between the data output interface and the storage unit. Such a buffer may serve as an extra memory for storing test result data for a certain time before permanently storing these data in the correspondingly assigned memory portions. Such a buffer unit may allow an uneven use of capacities of the individual partitions for a short period of time. However, on the long run, it may be ensured that each of the partitions is used essentially equally often.

The test apparatus may further comprise a demultiplexer unit arranged between the data output interface and the plurality of partitions and may be adapted to distribute individual items of the secondary test data to a respective one of the plurality of partitions based on address information included in the respective item of the secondary test data. Such a demultiplexer unit may receive the test data in the secondary format and may route this data to the individual partitions of the memory unit so as to store each test result data item in a correct or appropriate partition. Thus, the demultiplexer unit may be also denoted as a distribution unit.

BRIEF DESCRIPTION OF DRAWINGS

Embodiments of the present invention will be detailed subsequently referring to the appended drawings, in which features that are substantially or functionally equal or similar will be referred to by the same reference signs, and in which:

FIG. 6 illustrates a scrambling matrix in the context of polynomial scrambling.

FIG. 7 illustrates mapping between APG and ECR address.

FIG. 8 illustrates a matrix for an example of P=8 partitions versus 16*32 APG address.

FIG. 9 illustrates, for the example of FIG. 8, a partition "0" versus 16*32 APG address.

Figure 1:
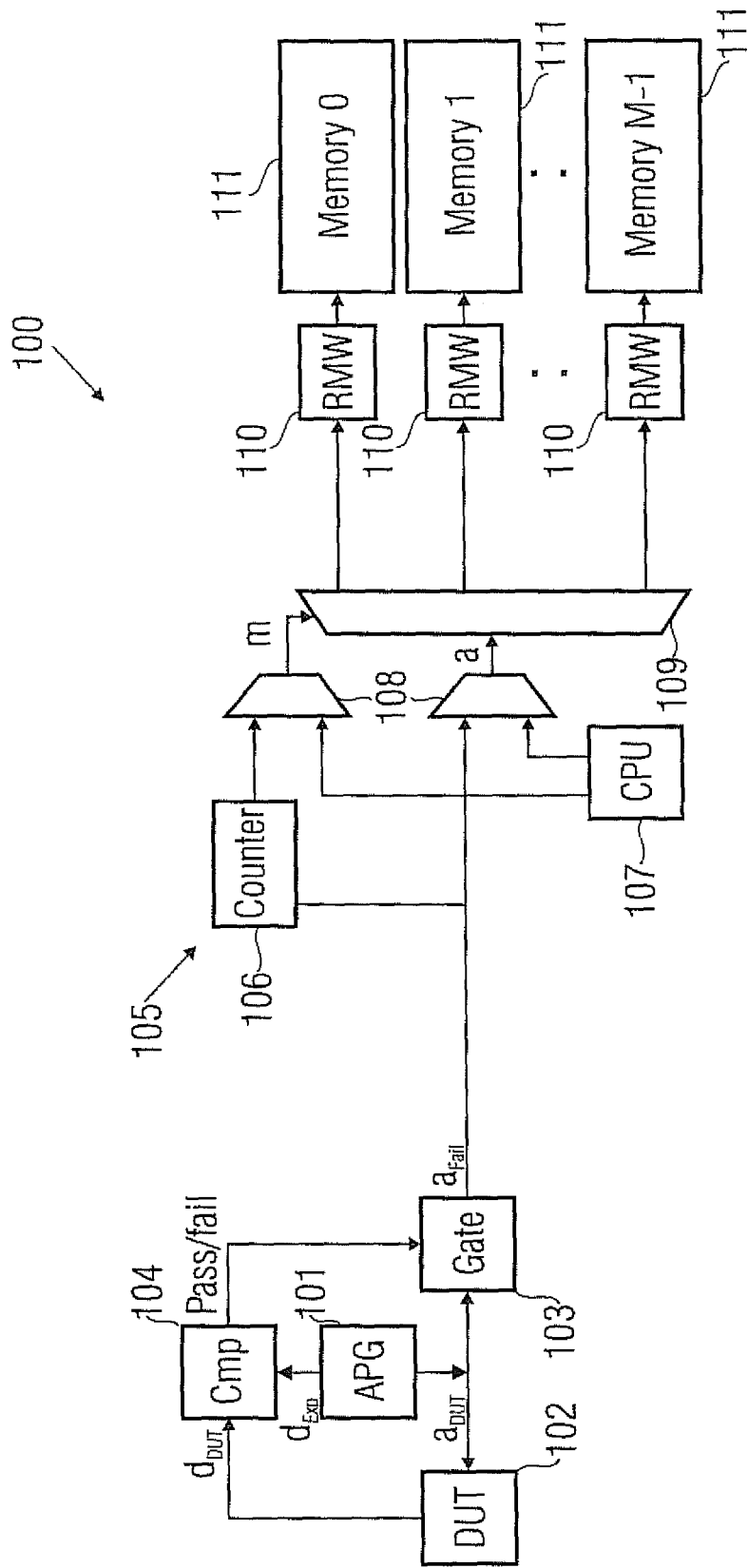
FIG. 1 shows a test apparatus comprising a test unit and a device for processing test data.

The illustration in the drawing is schematically.

DETAILED DESCRIPTION

In the following, storage efficient, high bandwidth error maps for memory tests according to exemplary embodiments of the invention will be explained.

According to an exemplary embodiment, multiple test result memories and/or partitioned test result memories are used for a test device for storing pass/fail information related to memory cells of a memory cell array as a device under test (DUT). Particularly, an address correlation in the context of a format transformation between memory cell addresses in the DUT and test result memory addresses may be implemented to manage large amounts of pass/fail information generated in a short time during carrying out the test and being indicative of a result of the test of the quality of the DUT.

Embodiments of the invention may be implemented in the context of an at-speed test of memory devices, for instance using an Automatic Test Equipment (ATE), like the 93000 test apparatus of Agilent Technologies.

Memory devices may be organized in $2^R$ rows and $2^C$ columns, which may yield dimensions of up to several Gigabits. An Algorithmic Pattern Generator (APG) may generate a sequence of accesses (row r, column c) and may create expected data $d_{Exp}$ for read accesses.

Access sequences usually walk along rows or columns or diagonals or anti-diagonals in steps (strides) of one, a power of two, sometimes arbitrary integers, often restricted to rectangular distributed blocks.

The Automatic Test Equipment may update a so-called ECR memory (Error Catch RAM) in real time, which ECR memory contains a pass/fail entry per memory cell a=(c,r). The ECR information may be used for repair memory cells which turn out to work improperly using redundant structures.

However, there may be a bandwidth gap between a DUT memory and an ECR memory. Particularly, tested DUT memories can be faster than (older) ECR memories in an Automatic Test Equipment. Because physical ECR memories may be more than 1-bit wide, updating the ECR may necessitate at least two accesses for a read-modified-write operation.

In memory test, so-called scrambling tables may be used to map between logical and physical memory addresses in order to assist in presenting ECR data in more convenient forms. This scrambling should be distinguished from scrambling for improved bandwidth.

Other mappings may be used to combine error information in order to provide a more coarse user view. According to an exemplary embodiment, such mappings may be used to increase bandwidth or decrease size.

In the following, a notation will be defined.

a=(c, r) may denote a DUT address "a" with A bits, comprising or consisting of a row address r with R bits and a column address c with C bits.

e=(m, w) may denote an ECR address e with E bits, comprising or consisting of a memory address m with N bits to select one of M memories, and a word address w with W bits. Particularly, wherein $0 \leq m \leq M-1$, $M \leq 2^N$, $N=\text{ceil}(\log_2(M))$.

An ECR partition number p with B bits selects one of P partitions, where P can be larger than or equal to or smaller than M. Particularly, $0 \leq p \leq P-1$, $P \leq 2^B$, $B=\text{ceil}(\log_2(P))$.

{a(k)} may denote an address sequence. A one-dimensional linear address sequence with start address a(0) and stride "s" may be given by $a(k)=a(0)+k \cdot s$. In many cases $s=2^S$, or a sum or difference of two powers of two (generalized diagonals), sometimes "s" can be any integer.

$$a = \sum_{k=0}^{A-1} a_k 2^k$$

$$a = (a_0, a_1, \ldots, a_{A-1})'$$

$$b_A = (1, 2, 2^2, \ldots, 2^{A-1})'$$

$$a = b'_A \cdot a$$

$$a(x) = a_0 + a_1 x + \ldots + a_{A-1} x^{A-1}$$

$$= \sum_{k=0}^{A-1} a_k x^k$$

$$a = c + 2^C r$$

$$a = (a_0, \ldots, a_{A-1})'$$

$$c = (c_0, \ldots, c_{C-1})'$$

$$r = (r_0, \ldots, r_{R-1})'$$

$$a = \binom{c}{r}$$

$$= (c_0, \ldots, c_{C-1}, r_0, \ldots, r_{R-1})'$$

Addresses may be represented as positive integer value a, wherein $0 \leq a \leq 2^A - 1$, a column bit vector a containing A bits $a_k$, and/or a polynomial a(x) with A coefficients $a_k$.

Modulo arithmetic may be applied:

With respect to integer division, a\P, for instance 13\5=2.

Remainder: a mod P=$[a]_P$, for instance $[13]_5=3$.

a=(a\P)·P+$[a]_P$, for instance 13=2·5+3.

$[a+b]_P=[[a]_P+[b]_P]_P$, and $[a \cdot b]_P=[[a]_P \cdot [b]_P]_P$.

By default, vector a is a column vector, a' is a row vector.

An injective function may denote a function in which no two arguments map to the same image.

gcd (.,.) indicates the greatest common divider. ceil(x) rounds to the nearest integer greater than or equal to x.

Conventionally, a single ECR memory may be used for storing test data. Such an ECR may be a fast but expensive SRAM. For such conventional approaches, ECR bandwidth has been high enough.

Another approach is the implementation of multiple time interleaved ECR memories.

In this context, subsequent accesses are dispatched in a round-robin fashion to T time interleaved ECR memory copies. The targeted copy is independent of the tested cell address a=(c, r). The aggregate bandwidth is T times higher compared to one copy. The total ECR memory size is T times larger, because each DUT cell could be mapped into any ECR copy, necessitating each copy to provide space for all addresses. All ECR copies are combined prior to using the result.

According to an exemplary embodiment of the invention, the T memory copies may be avoided while maintaining the bandwidth advantage of multiple memories.

FIG. 1 shows a block diagram of a test apparatus 100 according to the previously described approach.

An algorithmic pattern generator 101 generates a test sequence based on addresses $a_{DUT}$ of portions of a device under test DUT 102. Thus, $a_{DUT}$ is a particular DUT address which is supplied to a DUT 102 and to a gate unit 103. A test sequence is applied to the DUT by supplying stimulus signals, and in response to such stimulus signals, response data $d_{DUT}$ are supplied to a comparator unit 104. Pass/fail signals are generated by the comparator unit 104 based on a result of a comparison of the response data $d_{DUT}$ with expected result data $d_{Exp}$ as provided by the algorithm pattern generator unit 101. Resulting pass/fail data are provided to the gate unit 103 so as to generate result data $a_{Fail}$. A transaction per failing address occurs between the gate unit 103 and a processing portion 105.

In this processing portion 105, a counter unit 106 is provided which increments with every transaction. A central processing unit (CPU) 107 is provided to send control signals to logical gates 108. The respective logical gates 108 furthermore receive the information $a_{fail}$ from the gate unit 103 or counter information from the counter unit 106. A demultiplexer 109 distributes the test result data, by passing them to separate memory devices 111 via read-modify-write (RMW) units 110. The direction of the transaction from master to slave (although the data is not shown explicitly in FIG. 1) goes from left to right with respect to FIG. 1.

In the following, storage schemes in super computers will be explained. Super computers (SIMD=vector computer, MIMD=multi-processor computer) may use multiple memories.

Many different storage schemes are available that map a logical address "a" inside a multi-element structure uniquely onto a physical address "e" consisting of a selected memory "m" and a word address "w" inside the memory, such that vector addresses are distributed across multiple memories in order to parallelize the access, and thus achieve a faster average transaction rate.

In this context, e=(m, w)=f(a), wherein f( ) is injective. Furthermore, m=$f_m$(a), w=$f_w$(a).

Available storage schemes which may be implemented are low order interleaving, skewing, prime interleaving, prime RNS (Residue Number System, wherein a number is represented as a set of remainders (residues) from modulo divisions), Latin squares, and XOR scrambling. These technique may be implemented, according to exemplary embodiments of the invention, for a memory test, particularly for storing test result data. Usually, no distinction is made between a number of physical memories M and a number of partitions P, i.e. P=M is implied. The logical address consists of a single scalar "a" as opposed to a row and column address (c, r).

Non-balanced mappings may lead to a slow-down, whereas an ECR would miss errors, which might render it unusable. Only a "perfect" scheme would be applicable, as will be explained in the following. Therefore, applying storage schemes to memory test may be complicated.

Accessed data storages are often small. Therefore, conventional storage schemes may work only up to $M^2$ elements, for example Latin squares.

One available approach which is known as such and may be implemented advantageously is low-order interleaving. When the number of memories is a power of 2, $M=2^N$, the N low order address bits may select a memory. The remaining bits may select a word within a memory.

$$m=(m_0,\ldots,m_{N-1})'=(a_0,\ldots,a_{N-1})'$$

$$w=(w_0,\ldots,w_{W-1})'=(a_N,\ldots,a_{A-1})'$$

$$N+W=A$$

This is equivalent to:

$$m=[a]_M=[a]_{2^N}$$

$$w=a\backslash M=a\backslash 2^N$$

Properties of such a scheme are that it assumes $M=2^N$. No explicit hardware may be needed (division by $2^N$ and modulo $2^N$ are just bit selections). A conflict may occur when the stride "s" shares a common divider with $M=2^N$, i.e. for all even strides, worst when the stride is a multiple of $2^N$. gcd(s, M) should be one. Thus, low order interleaving as such may be inappropriate for memory test.

Next, skewing (K-way skewing) will be explained.

Such a scheme may be similar like low order interleaving, but "skews" a mapping every $2^N, 2^{2N}, 2^{3N}, \ldots, 2^{KN}$ addresses to break the repetitions found in low order interleaving.

$$m = \left[\sum_{k=0}^{K} a\backslash 2^{kN}\right]_{2^N}$$

$$w = a\backslash 2^N$$

$$(K-1)\cdot N \geq A$$

Properties of such a scheme are that it assumes $M=2^N$. The hardware of such a system is quite simple, and just needs a few adders. No conflict occurs for strides $s=2^S$, for large enough K. However, conflicts may occur with some diagonals and anti-diagonals. However, the skewing scheme may need some adaptation to be suitable for memory test.

In the following, prime interleaving will be explained.

The number of memories M is an odd prime P, M=P, for instance P=7. The formula is similar to low order interleaving:

$$m=[a]_P$$

$$w=a\backslash P$$

$[a]_P$ can be calculated as weighted sum of pre-computed coefficients.

Properties of the prime interleaving scheme are that hardware integer division by a prime (for $w=a\backslash P$) may be impractical. Thus, prime interleaving may need adaptation to be suitable for memory tests.

The system may be conflict-free for almost all strides s, except when s is an integer multiple of P, i.e. conflict-free if gcd (S, P)=1.

Conflicts may occur for many diagonals and anti-diagonals for reasonably small P, for instance $2^{3j}-1$ is a multiple of seven for any integer positive j. Thus, prime interleaving may need adaptation for practical number of memories M=P. A prime number of memories may be awkward.

Next, prime RNS (Residue Number System) will be explained.

Such a scheme eliminates division by a prime.

$$m=[a]_P$$

$$w=[a]_{2^W}$$

$$P\cdot 2^W > 2^A$$

$$\gcd(P,2)=1$$

The Chinese Remainder Theorem from number theory still guarantees an injective mapping $a\to(m, w)$.

P could also be any odd integer.

Properties of such a scheme are a reasonable hardware effort. However, the same conflicts with some strided diagonals and anti-diagonals may occur as in "prime interleaving". Thus, the prime RNS may need some adaptation for practical number of memories M=P. Distributed holes in memory may be inconvenient.

In the following, the Latin square concept will be explained.

A (perfect) Latin square L is a $(2^N, 2^N)$ matrix with integer elements from 0 to $2^N-1$, where no such element occurs more than once in any row or column (or diagonal or anti-diagonal).

Row r and column c look up (M, M) Latin square L to determine memory m, $M=2^N$.

$$m=L(c,r)$$

$$w=a\backslash 2^N$$

$$M=\max(C,R)$$

Properties of the Latin square concept are conflict-free rows, columns, diagonals and anti-diagonals. Latin square should have size of the DUT memory, and may need therefore adaptation for memory test. Furthermore, Latin square necessitates many memories $M=2^N$ and may therefore need further adaptation to be used for a memory test.

In the following, scrambling will be explained.

Each bit in m is a weighted XOR sum of the address bits in a, with non-singular (N, A) weight matrix X over GF(2) with operations XOR and AND. GF(2) denotes a Galois Field over prime=2 elements with XOR and AND as operations.

$$m=X\cdot a$$

$$w=a\backslash 2^N$$

It may be difficult to determine X ($2^{96}$ possible X for $M=2^3$ and A=32).

Properties of the scrambling scheme are that it assumes $M=2^N$ memories, has a simple hardware configuration, may involve conflicts depending on the choice of X, and may involve the difficulty as to how to choose X.

In the following, polynomial scrambling will be explained which may also be denoted as "polynomial interleaving".

An (N, A) matrix X contains "A" subsequent states from a maximum length LFSR (Linear Feedback Shift Register) of order "N".

However, conflict-free diagonals may necessitate "A" unique columns in X (LFSR states). Because the maximum length is $2^N-1$, this necessitates $A\leq 2^N-1=M-1$, i.e. $M>A$.

Properties of the polynomial scrambling scheme are that it assumes $M=2^N$ memories, involves the simple hardware, and may be conflict-free with buffer depth 1 for $s=2^S$ strides or $2^S$ strided diagonals/anti-diagonals, when $A\leq M-1$. Often, many memories are necessitated. However, the number of necessitated memories may be reduced by dividing a memory into a plurality of partitions. Further, conflicts for various integer strides may occur.

According to an exemplary embodiment of the invention, the ECR memory may be partitioned into M>1 smaller physical memories with a total of P>1 partitions. P can be larger or smaller than M or equal to M. According to an exemplary embodiment, logical partitions and physical memories may be distinguished.

According to an exemplary embodiment, the row/column address may be mapped onto a partition $p=f_P(c, r)$ such that important (or relevant) address sequences $\{a(k)\}=\{(r(k), c(k))\}$ map equally often onto all P partitions, with little clustering. Then, partition p may be mapped onto memory m. The mapping $(c, r) \rightarrow w$ may be determined such that $(c, r) \rightarrow m$, w is injective and easy to implement.

A typical class of mappings is the following:

$$p=f_P(a)$$

$$m=[p]_{2^N}, M=2^N$$

$$w=a\backslash 2^N, \text{or } w=[a]_{2^W}$$

Buffering may smoothen short-term clustering of accesses to equal partitions/memories.

The mapping may be used for all accesses, making it transparent for the software.

In the following, referring to FIG. 2, a test apparatus 200 according to an exemplary embodiment of the invention will be explained.

The test apparatus 200 comprises a test unit 201 adapted for carrying out a test for testing a device under test 202 and for generating primary test data indicative of the test. Furthermore, the test apparatus 200 comprises a device 203 for processing the generated primary test data.

The device 201 for processing test data comprises a data input interface 204 adapted for receiving primary test data indicative of a test carried out for testing a device under test 202, the primary test data being provided in a primary format a. A processing unit 205 is adapted for generating secondary test data in a secondary format (m, w) by transforming the primary test data from the primary format a into the secondary format (m, w). Furthermore, a data output interface 206 is provided which is adapted for providing the secondary test data in the secondary format for storing the secondary test data in a storage device 207.

The data input interface 204 receives the primary test data in the primary format a being indicative of an address of a tested portion of the device under test 202 and being indicative of a test result (namely whether the assigned test portion has passed or failed the test) of the tested portion of the DUT 202.

According to the described embodiment, the device under test 202 is a DRAM memory product, that is to say a matrix-like arrangement of memory cells. Thus, the address "a" is indicative of a row "r" and a column "c" of the tested memory cell of the memory array 202. Generally, embodiments of the invention may be applied to any kind of memory devices, like DRAMs or Flash memories. However, DRAMs are particularly suitable for a test using embodiments of the invention, since this type of fast memories is particularly prone to bandwidth problems.

The data output interface 206 provides the secondary test data in the secondary format (m, w) being indicative of an address of the storage unit 207 in which the test result of the tested portion of the DUT 202 is to be stored and being indicative of a test result (that is to say whether the tested portion has passed or failed the test) of the tested portion of the DUT 202.

Particularly, the address m may be indicative of a memory part (for instance a separate physical memory or a part of a physical memory) 207a to 207c of the storage device (for instance the memory part 207a) in which memory part the test result of the tested portion of the device under test 202 is to be stored, and 'w' may be indicative of an address within the memory part of the storage unit 207 in which memory part the test result of the tested portion of the device under test 202 is to be stored.

Therefore, the processing unit 202 may perform a storage map $a \rightarrow (m, w)$. Thus, the processing unit 205 transfers the test result data into the secondary format by carrying out a coordinate transformation $a \rightarrow (m, w)$ based on the test data in the primary format.

The processing unit 205 maps the primary test data into the secondary test data in such a manner that items of the secondary test data, on the average (that is to say on the long run), may be distributed essentially equally often to different memory parts 207a to 207c of the storage unit 207.

The storage unit 207 is coupled to the data output interface 206 and is adapted for storing the secondary test data in the secondary format. Particularly, the storage unit 207 is divided into the plurality of memory parts 207a, 207b, ..., 207c, each of the plurality of memory parts 207a, 207b, ..., 207c being adapted for storing a part of the secondary test data in the secondary format.

Furthermore, the test apparatus 200 comprises a plurality of buffer units 208a, 208b, ... 208c arranged between the data output interface 206 and the plurality of memory parts 207a, 207b, ..., 207c of the storage unit 207. Beyond this, the test apparatus 200 comprises a demultiplexer unit 209 arranged between the data output interface 206 and the plurality of memory parts 207a, 207b, ..., 207c and being adapted to distribute individual items of the secondary test data to a respective one of the plurality of memory parts 207a, 207b, ..., 207c based on address information included in the respective item of the secondary test data.

Figure 2:
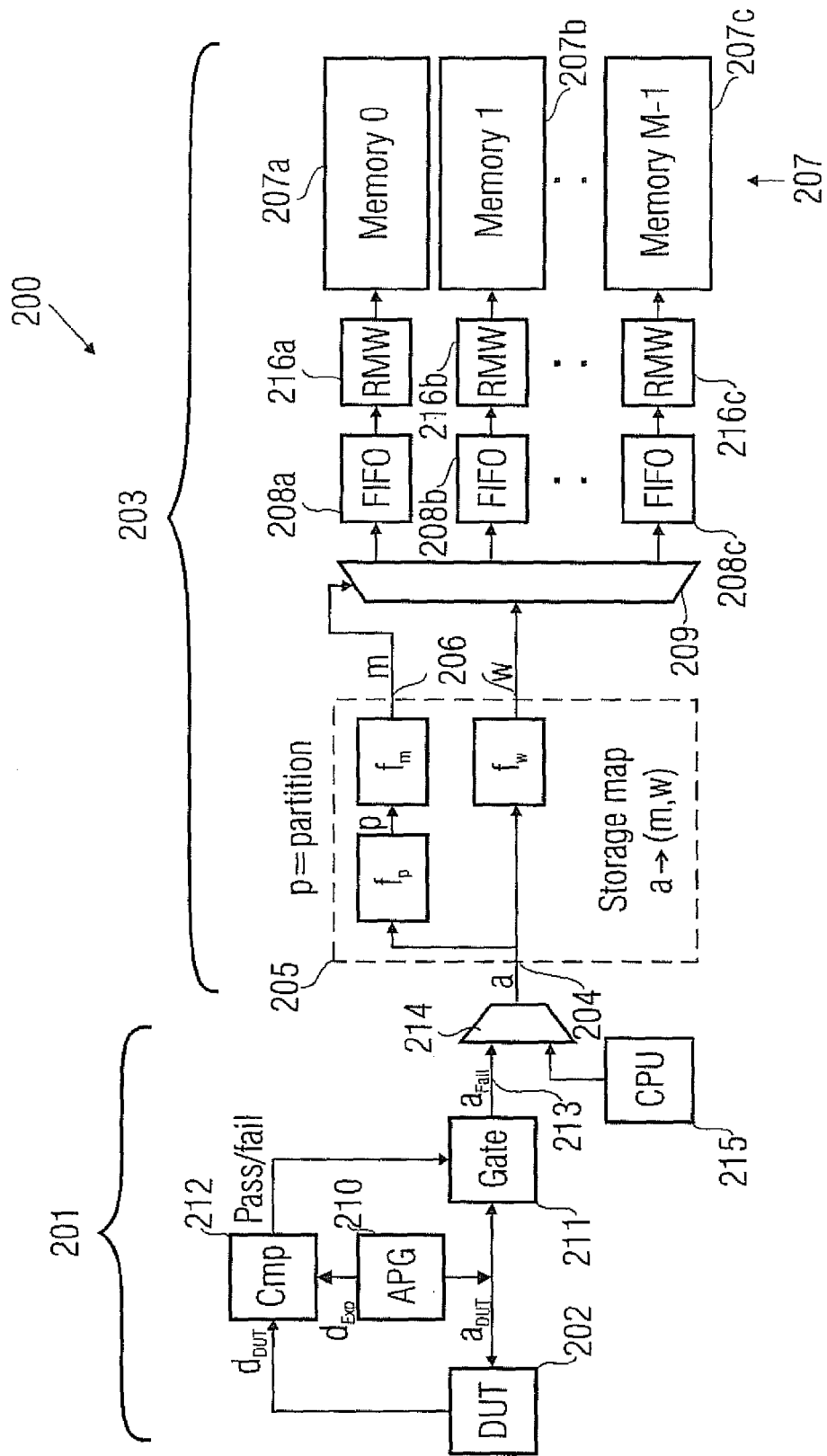
FIG. 2 illustrates a test apparatus including a test unit and a device for processing test data according to an exemplary embodiment of the invention.

As can be taken from FIG. 2, an Algorithm Pattern Generator 210 generates address sequences $a_{DUT}$ which are supplied to the DUT 202 and to a gate unit 211. Stimulus signals applied to the DUT 202 result in the generation of response signals $d_{DUT}$ which are provided to a comparator unit 212. Pass/fail signals indicating whether a tested portion of the DUT 202 has passed or failed the test are generated by the comparator unit 212 by comparing the response signals $d_{DUT}$ with expected data $d_{Exp}$ and are supplied to the gate unit 211.

As indicated with reference numeral 213, a transaction per failing address is carried out by providing a failing address $a_{Fail}$ to an input of a multiplexer or selector unit 214. Another input of the multiplexer 214 is provided with a control signal from a central processing unit (CPU) 215. Thus, an address a is provided at the input interface 204 of the processing unit 205.

Within the partitioning unit 205, a storage map $a \rightarrow (m, w)$ is generated, that is to say a coordinate transformation from a to (m, w) is performed. Although corresponding data are not explicitly shown in FIG. 2, a direction of a transaction from master to slave goes from left to right with respect to FIG. 2.

The address signal "a" as provided at the input 204 may be a 36 bit signal indicating row r and column c of a particular memory cell of the memory device under test 202. The address signal m is a 6 bit signal indicating an address of a particular one of the memory parts 207a to 207c of the memory 207 which is competent for storing the respective pass/fail information. Furthermore, a 30 bit signal w indicates an address within the competent memory part 207a to 207c defined by m at which address the information shall be stored.

A demultiplexer unit 209 demultiplexes the signal w so as to provide the signals to a corresponding one of the memory parts 207a to 207c of the memory unit 207. However, each of the memory parts 207a to 207c is separated from a corresponding output of the demultiplexer unit 209 by a FIFO buffer 208a to 208c and a corresponding read-modify-write block 216a, 216b, 216c.

Thus, a proper mapping can be obtained with the scheme shown in FIG. 2.

Such a mapping may be conflict-free. Ideally, important address sequences are mapped such that they cycle through all memory parts/partitions before they revisit the same memory part/partition again. Long-term, all memory parts/partitions should be visited essentially equally often, with little clustering of equal memory parts/partitions.

The mapping is injective, so that different DUT addresses a=(r, c) should map to different ECR addresses e=(m, w).

Ideally, the mapping is bijective (no holes). The bandwidth multiplier may be equal to or close to M.

Thus, the system shown in FIG. 2 may be transparent to software and may necessitate only a low hardware effort. No integer division may be necessitated. The total ECR memory size may be equal to or close to the DUT memory size (that is to say there is only little storage overhead). A power of two numbers of memories may simplify decoding and may make it easier to achieve a contiguous memory space.

A large prime RNS (Residue Number System) scheme may be implemented in the system according to an exemplary embodiment of the invention.

P may be chosen large enough to be relatively prime to all relevant strides (strided diagonals and strided anti-diagonals). Because P is too large to be the number of memories, two cascaded modulo operations may be performed.

$$p = [a]_P, B = \lceil \log_2 P \rceil$$

$$m = [p]_{2^N}, M = 2^N$$

$$w = [a]_{2^W}$$

$$W = A + 1 - N$$

Properties of such a system are that the system may be conflict-free with little buffering, unless the stride "s" is an integer multiple of P. For large enough P, no conflict with $2^S$ strides and $2^S$ strided diagonals and anti-diagonals occurs. Some memories are used more often than others, because gcd(P, M)≠M. This means that the bandwidth multiplication factor may be slightly less than B. Holes in the memory occur.

In the following, it will be explained how a skewed Latin square scheme may be implemented in a system according to an exemplary embodiment of the invention.

To reduce the number of memories and the size of the Latin square L, R row address bits, respectively C column bits, may be condensed to B bits using skewing before looking up a ($2^B$, $2^B$) Latin square L.

$$i = \left[\sum_{k=0}^{K} c \backslash 2^{kB}\right]_{2^B}$$

$$j = \left[\sum_{k=0}^{K} r \backslash 2^{kB}\right]_{2^B}$$

$$p = L(i, j)$$

$$m = [p]_{2^N}, \quad M = 2^N$$

$$w = (c + r \cdot 2^C) \backslash 2^N$$

Properties of such a system are that it works for any size DUT memory, M is independent of R and C. The Latin square size may be only ($2^B$, $2^B$). Furthermore, a conflict-free performance of diagonal and anti-diagonal with row and column strides one is possible.

Next, a scrambled Latin square concept according to an exemplary embodiment of the invention will be described.

To reduce the number of memories and the size of Latin square L, R row address bits, respectively C column address bits, may be condensed to B bits using XOR functions before looking up a ($2^B$, $2^B$) Latin square L.

$$i = X_c \cdot c, \quad i = \sum_{k=0}^{B-1} i_k 2^k$$

$$j = X_r \cdot r, \quad j = \sum_{k=0}^{B-1} i_k 2^k$$

$$p = L(i, j)$$

$$m = [p]_{2^N}, \quad M = 2^N$$

$$w = (c + r \cdot 2^C) \backslash 2^N$$

Properties of such a system are that it works for any size DUT memory, M is independent of R and C. The Latin square size is only ($2^B$, $2^B$). Furthermore, conflict-free diagonal and anti-diagonal performance with row and column strides one may be obtained.

Next, interleaved (polynomial) scrambling according to an exemplary embodiment will be explained.

For reduced or eliminated conflicts with a given (small) number of memories M, the address (c, r) is scrambled using a (B, C+R) matrix X yielding partition p, wherein $0 \le p \le P-1$, P>M, which is then reduced modulo M to fewer memories.

$$p = X \cdot \binom{c}{r}$$

$$p = (p_0, \ldots, p_{B-1})$$

$$C + R \le 2^B - 1$$

$$m = [p]_{2^N}, \quad M = 2^N$$

$$w = (c + r 2^C) \backslash 2^N$$

Properties of such a system are that it works for any size DUT memory, M is independent of R and C. Such a system may have the same conflict behavior as conventional scrambling with P memories, but with only M>P memories.

Next, skewed interleaved (polynomial) scrambling according to an exemplary embodiment will be explained.

Address "a" is first skewed, yielding "b", then scrambled to determine partition p, and finally reduced to modulo M to select memory m.

$$b = \left[\sum_{k=0}^{K} a \backslash 2^{kB}\right]_{2^B}$$

$$(K-1) \cdot B \ge A$$

$$b = (b_0, \ldots, b_{A-1})$$

$$p = X \cdot b$$

-continued $$m = [p]_{2^N}, \quad M = 2^N$$

$$w = a \backslash 2^N$$

Such a system may have the property that conflicts with integer strides are broken. However, the system may necessitate 2P buffer depths for almost all strides.

According to an exemplary embodiment, a memory test scheme is provided, with an ATE or a DUT board, or on chip DFT. Such a system may be based on the assumption that P=M. The ECR may be partitioned into M>1 memories. Such a system may work with an injective map a=(c, r)→e=(m, w). Moreover, m=$f_m$(c, r) may be more than a simple subset of bits from "c" and "r".

For an address sequence with stride s=M, the aggregate bandwidth with M memories is higher than with one single memory. Ideally, the speed increase is a factor of M, in any case a factor larger than one.

The total size of all M memories may be less than M times the size necessitated with one single memory. Ideally, the memory reduction is a factor of M, in any case a factor larger than one.

Particularly for the case P≠M, a memory device according to an exemplary embodiment may be provided which may be provided with an ATE or a DUT board, or on chip DFT. In such a scenario, the ECR may comprise a consist of P>1 partitions across M>1 memories. With an injective map a=(c, r)→e=(m, w), consisting of p=$f_p$(c, r), m=$f_m$(p), w=$f_w$(c, r), m=$f_m$($f_p$(c, r)) may be more than a simple subset of bits from "c" and "r".

For an address sequence with stride s=P, the aggregate bandwidth with M memories may be higher than with one single memory. Ideally, the speed increase is a factor of M, in any case a factor larger than one.

The total size of all M memories may be less than M times the size necessitated with one single memory. Ideally, the memory reduction is a factor of M, in any case a factor larger than one.

Furthermore, such a system may be combined with a programmable mapping to improve or optimize for a given set of address sequences. According to another exemplary embodiment, this can be combined with buffering to tolerate short-term clustering of mapped partitions and therefore memories. According to another exemplary embodiment, this may be combined with a read out through the same mapping to make invisible to software. Furthermore, such a system may be combined with multiple mappings which are cascaded.

The mapping may include the computation of "x modulo P", where P is odd. This may include prime interleaving, and prime RNS. Furthermore, the mapping may include computation of "x mod P" and "y mod B", where P is odd, P≠B. This may include large prime RNS.

Beyond this, the mapping may include summation of at least two bit fields in (c, r), which may include skewing.

Furthermore, the mapping may include the lookup of a Latin square.

Beyond this, the mapping may include the look-up of a Latin square where the computation of the indices may include summation of at least two bit fields from "a" or (c, r). This may include a skewed Latin square scheme.

Moreover, the mapping may include the lookup of a Latin square where the computation of the indices may include XOR functions of "a" or (c, r). This may include a scrambled Latin square concept.

The mapping may also include an XOR table, which may include scrambling.

The mapping may include an XOR table where multiple consecutive columns are linearly independent.

Beyond this, mapping may include an XOR table where multiple consecutive columns corresponding to the row address "r", logically processed according to an XOR operation with multiple consecutive columns corresponding to the column address "c", are linearly independent.

The mapping may include an XOR table, whose content has been generated using polynomial division (LFSR, PRBS, Hamming codes, BCH codes, RS codes, etc.). This may include polynomial scrambling.

The mapping may further include an XOR table, whose content has been generated using polynomial division with a polynomial of order equal to or larger than N (M=$2^N$).

Beyond this, the mapping may include an XOR table whose index is computed as a summation of at least two bit fields from "a" or (c, r). This may include skewed scrambling.

In the following, a more detailed description of a storage efficient, high bandwidth error map using address spreading based on polynomial scrambling will be given.

Polynomial scrambling may spread APG addresses evenly across multiple ECR memories. The aggregate ECR bandwidth may be multiplied with a number of memories. No storage overhead may be necessitated, since the ECR is just partitioned, and no copies are needed. The system may work for all targeted address sequences. The system may be easy to implement (XORs, FIFOs). The scheme may be transparent to software. Furthermore, the architecture may enable much lower cost ECR/RA solutions.

Conventionally, a bandwidth problem may occur since the necessitated ECR memory bandwidth may be higher than available by DRAMS. (Latest) tested DRAM memories can be faster than (older) DRAM chips used for ECR memory in ATE. Because physical ECR memories are more than one bit wide, updating the ECR may necessitate at least two accesses for a read-modify-write operation. A limited transaction density for arbitrary small accesses may occur (for instance 62% with DDR2). Thus, conventionally multiple ECR memories are needed.

According to an exemplary embodiment, failing addresses may be spread across multiple parallel memories. In such a scenario, it is possible to partition the ECR into P=$2^B$=64=$2^6$ non-overlapping partitions in M=$2^N$=8=$2^3$ memories with 8 banks each, i.e. one partition per a bank. Failing APG addresses "a" may be mapped onto P=64 partitions "p" using simple XORs such that all relevant address sequences may be spread evenly across all P partitions with little temporal clustering. The six bit partition number "p" may select the memory "m" and the bank "b". The selected word number within a (memory, bank) may be simply any "All-6" bits of the failing APG address "a". FIFOs per partition may smoothing short-term clustering of accesses to equal partitions. The mapping may be used for all accesses, making it transparent to software.

Figure 3:
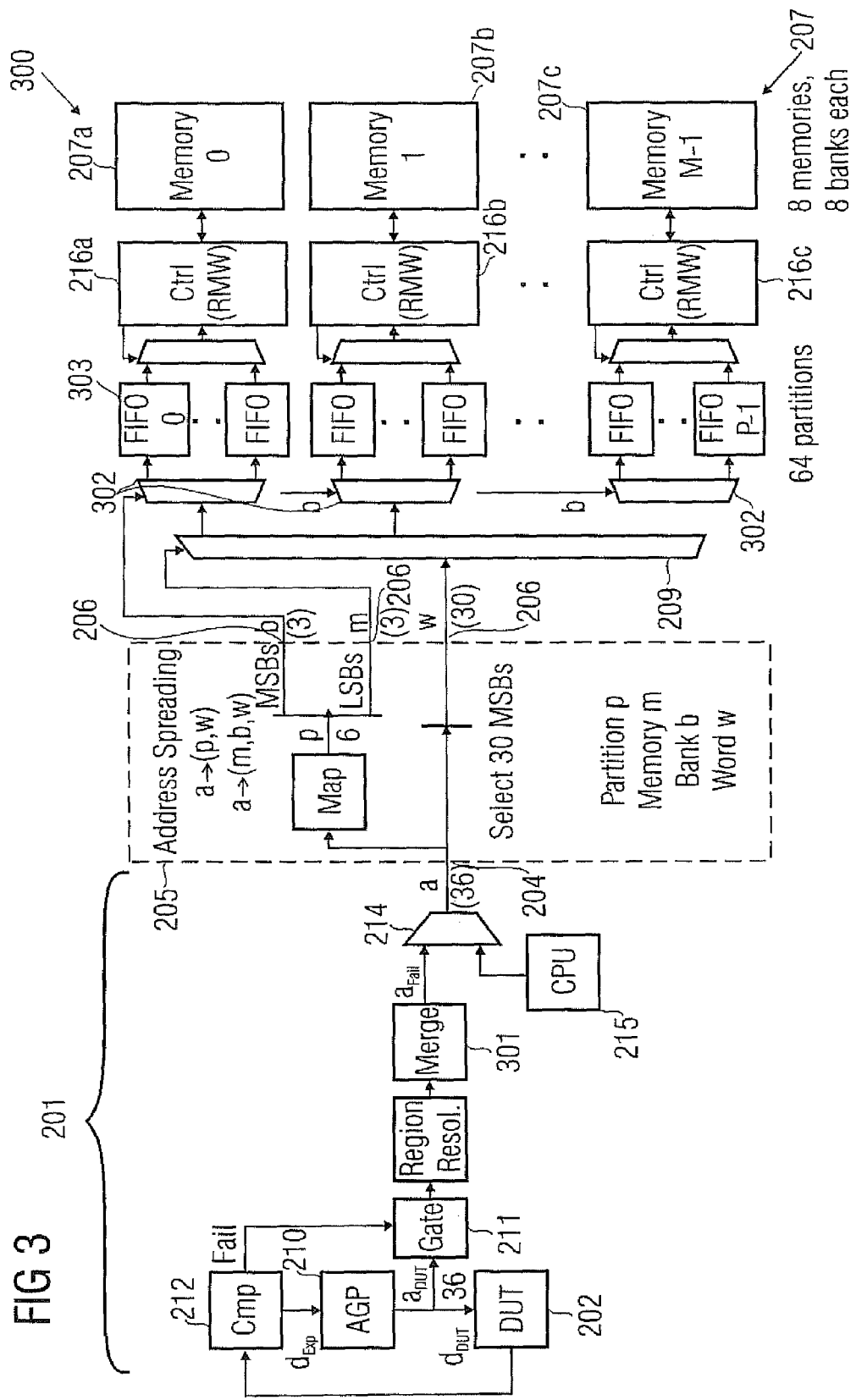
FIG. 3 illustrates a test apparatus comprising a test unit and a device for processing test data according to another exemplary embodiment of the invention.

FIG. 3 shows a test apparatus 300 according to an exemplary embodiment.

The test apparatus 300 only distinguishes in some individual aspects from the test apparatus 200. For instance, a merging unit 301 is provided in the test unit 201 for merging equal failing addresses. Beyond this, the mapping in the processing unit 205 provides at an output 206 three bank bits b, three memory bits m and 30 word bits. Logic gates 302 are arranged between a demultiplexer 209 and FIFOs 303 and between the FIFOs 303 and the RMW units 216a to 216c.

Next, referring to FIG. 4, address spreading with scrambling will be explained.

All B=6 bits of the partition number "p" are weighted XOR sums of all "A" (for instance 36) bits of the failing address "a". The AND weights $x_{ij}$ are stored in programmable registers. Such a mapping may be denoted as scrambling (which is the same method as for logical→physical address scrambling, but for a different purpose). Such a mapping is not to be confused with logical→physical address scrambling which scrambles rows and column addresses independently, whereas here the scrambled partition number may be a function of all address bits including rows and columns.

Figure 4:
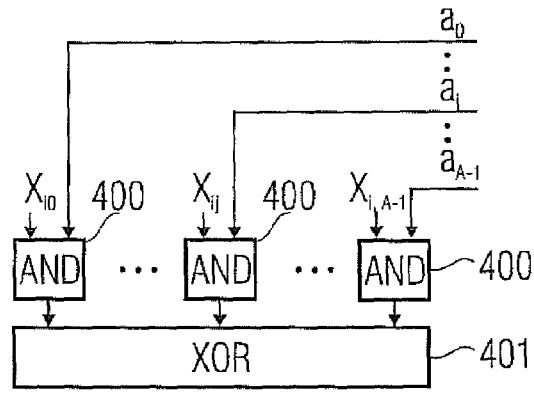
FIG. 4 illustrates a logical architecture for scrambling in the context of address spreading.

The scheme of FIG. 4 includes AND gates 400 and an OR gate 401.

$$\begin{pmatrix} p_0 \\ \vdots \\ p_{B-1} \end{pmatrix} = \begin{pmatrix} X_{00} & X_{01} & \cdots & X_{0,A-1} \\ \vdots & \vdots & \ddots & \vdots \\ X_{B-1,0} & X_{B-1,1} & \cdots & X_{B-1,A-1} \end{pmatrix} \cdot \begin{pmatrix} a_0 \\ a_1 \\ \vdots \\ a_{A-1} \end{pmatrix}$$

$$p = X \cdot a$$

Figure 5:
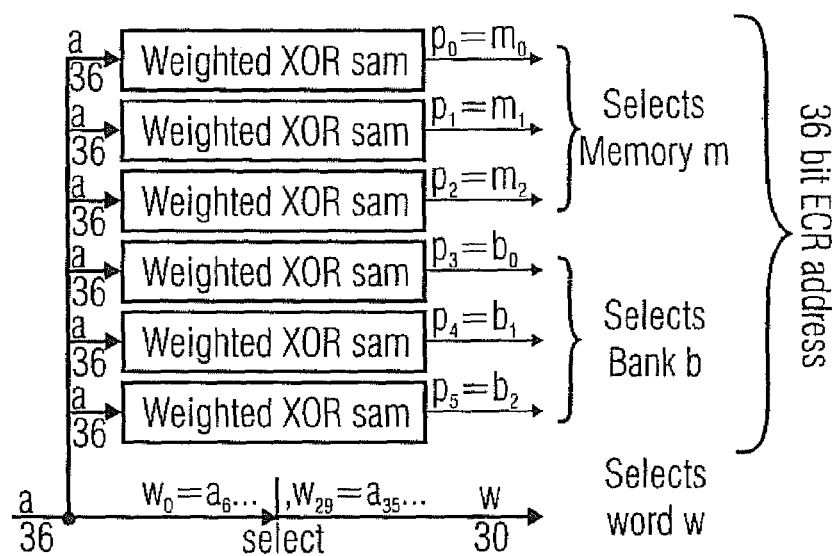
FIG. 5 illustrates ECR address generation in the context of address spreading.

FIG. 5 illustrates ECR address generation by address spreading.

The memory number "m", bank number "b", and word number "w" within a (memory, bank) are simple bit selections from the partition number "p" and the failing APG address "a". For example, 64 partitions (B=6), 8 memories (N=3), 8 banks/memory and A=36 address bits may be assumed.

$$p = X \cdot a$$

$$m = (m_0, \ldots, m_{N-1}) = (p_0, \ldots, p_{N-1})$$

$$b = (b_0, \ldots, b_{B-N-1}) = (p_N, \ldots, p_{B-1})$$

$$w = (w_0, \ldots, w_{W-1}) = (a_0, \ldots, a_{A-1})$$

$$W = A - B$$

or $$m = [p]_{2^N}$$

$$b = p \backslash 2^N$$

$$w = a \backslash 2^B$$

Next, referring to FIG. 6, a scrambling matrix 600 in the context of polynomial scrambling will be explained.

A software component may fill the B·A matrix X with "A" successive states of a maximum length LFSR with "B" flip-flops.

The following examples will use the polynomial $q(x) = x^3 + x^2 + 1$.

In the following, referring to FIG. 7, a mapping scheme 700 between APG and ECR address will be explained, for the example with 8 partitions.

Non-singularity of matrix X, leads to a 1:1 mapping between a failing APG address "a" and ECR address (m, w). This may prevent memory size overhead and inconvenient memory holes.

In the following, some assumptions will be made with regard to conflict behaviour.

Unless otherwise noted, the following worst case conditions are assumed: In every APG clock cycle there is a new read address (no writes, no idle cycles); every read address fails; no locality of subsequent accesses increases the ECR bandwidth; the maximum ECR transaction rate (after refresh and idle subtracted) equals the APG address rate; unless otherwise noted, there is no additional bandwidth to deal with large clustering of equal partitions.

When a finite buffer of depth "b" is sufficient to cover an address sequence under these conditions, the address sequence is called conflict-free with buffer "b".

This condition can be verified using the following pseudo code:

p(k) is the selected partition corresponding to the k-th primary data set.

```
buffer(1...P) = 0; # Each partition starts with an empty buffer
for k=1... # For each address step
    buffer( p(k) ) += 1; # Buffer of targeted partition
increases
    if buffer( p(k) ) > b, return "OVERFLOW";
    if buffer( p(k) ) > 0 # Unless the buffer is already empty
        # One buffer entry is removed every P-th address
        buffer( mod(k,P) ) -=1;
    end
end
return 'OK'
```

However, in practice, refresh may necessitate in many cases additional buffering.

Next, some results related to conflict behavior will be presented.

Different address sequences have been investigated, namely linear constant stride, rectangular blocks, triangular blocks, and butterfly patterns.

Generally speaking, all investigated address sequences are conflict-free with a reasonable buffer, as long as the involved strides are "1", or a power of 2, or a sum/difference of a power of 2 column plus/minus a power of 2 row (generalized diagonal) and blocks are aligned at multiples of P columns and P rows.

Arbitrary alignments may necessitate 2× or 4× buffer sizes.

FIG. 8 shows a scheme 800 for P=8 partitions versus 16·32 APG addresses.

In each P-aligned P·P block, every row/column/main diagonal/and anti-diagonal contains each partition exactly once.

FIG. 9 shows a scheme 900 with a partition "0" versus 16·32 APG addresses.

In each P-aligned P·P block, every row/column/main diagonal/and anti-diagonal contains each partition exactly once.

It should be noted that the term "comprising" does not exclude other elements or features and the "a" or "an" does not exclude a plurality. Also elements described in association with different embodiments may be combined. It should also be noted that reference signs in the claims shall not be construed as limiting the scope of the claims.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A device for processing test data, the device comprising:
    a data input interface configured to receive primary test data indicative of a test carried out for testing a device under test, the primary test data being provided in a primary format;
    a processing unit configured to generate secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates; and
    a data output interface configured to provide the secondary test data in the secondary format for storing the secondary test data in a plurality of storage units.

2. The device of claim 1, wherein the data input interface is configured to receive the primary test data in the primary format being indicative of an address of a tested portion of the device under test and being indicative of a test result of the tested portion of the device under test.

3. The device of claim 2, wherein the address of the tested portion of the device under test is indicative of a row and a column of the tested portion of the device under test.

4. The device of claim 2, wherein the test result of the tested portion of the device under test is indicative of whether the tested portion of the device under test has passed the test or has failed the test.

5. The device of claim 1, wherein the data output interface is configured to provide the secondary test data in the secondary format being indicative of an address of the storage unit in which a test result of a tested portion of the device under test is to be stored and being indicative of the test result of the tested portion of the device under test.

6. The device of claim 5,
    wherein the address of the storage unit is indicative of a partition in which partition the test result of the tested portion of the device under test is to be stored, and
    wherein the address of the storage unit is indicative of an address within the partition in which partition the test result of the tested portion of the device under test is to be stored.

7. The device of claim 6, wherein the processing unit is configured in such a manner that the primary test data is mapped into the secondary test data in such a manner that items of the secondary test data are, on the average, distributed essentially equally often to different partitions.

8. The device of claim 5, wherein the test result of the tested portion of the device under test is indicative of whether the tested portion of the device under test has passed the test or has failed the test.

9. The device of claim 1, wherein the processing unit is configured in such a manner that the primary format is different from the secondary format.

10. The device of claim 1, wherein the processing unit is configured to map the primary test data into the secondary test data in a bijective manner.

11. The device of claim 1, wherein the processing unit is configured to generate intermediate test data in an intermediate format by transforming the primary test data from the primary format into the intermediate format, and
    wherein the processing unit is configured to generate the secondary test data in the secondary format by transforming the intermediate test data from the intermediate format into the secondary format.

12. The device of claim 1, wherein the processing unit is configured to map the primary test data into the secondary test data using at least one of the group including a skewed Latin square, a scrambled Latin square, interleaved scrambling, interleaved polynomial scrambling, skewed interleaved scrambling, skewed interleaved polynomial scrambling, and a combination thereof.

13. A test apparatus, the test apparatus comprising:
    a test unit configured to carry out a test for testing a device under test and for generating primary test data indicative of the test; and
    a device for processing test data, the device comprising a data input interface configured to receive the primary test data indicative of the test carried out for testing the device under test, the primary test data being provided in a primary format;
    a processing unit configured to generate secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates; and
    a data output interface configured to provide the secondary test data in the secondary format for storing the secondary test data in a plurality of storage units, for processing the generated primary test data.

14. The test apparatus of claim 13, configured as a memory test device for testing one or a plurality of memory devices under test.

15. The test apparatus of claim 13, comprising the plurality of storage units coupled to the data output interface and configured to store the secondary test data in the secondary format.

16. The test apparatus of claim 15, wherein the plurality of storage units are divided into a plurality of partitions, each of the plurality of partitions being configured to store the secondary test data in the secondary format.

17. The test apparatus of claim 16, wherein the plurality of storage units or the plurality of partitions are physically separate entities.

18. The test apparatus of claim 16, wherein the plurality of storage units or the plurality of partitions comprise separate address inputs.

19. The test apparatus of claim 16, wherein the plurality of partitions are portions of a physical storage unit.

20. The test apparatus of claim 16, comprising a demultiplexer unit arranged between the data output interface and the plurality of partitions and configured to distribute individual items of the secondary test data to a respective one of the plurality of partitions based on address information comprised by the respective item of the secondary test data.

21. The test apparatus of claim 13, comprising one or a plurality of buffer units arranged between the data output interface and the storage unit.

22. A method of processing test data, wherein the method comprises:
    receiving primary test data indicative of a test carried out for testing a device under test, the primary test data being provided in a primary format;
    generating secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates;

providing the secondary test data in the secondary format for storing the secondary test data in a plurality of storage units.

23. A non-transitory computer-readable medium, in which a computer program for processing test data is stored, which computer program, when being executed by a processor, is configured to control or carry out a method of:

receiving primary test data indicative of a test carried out for testing a device under test, the primary test data being provided in a primary format;

generating secondary test data in a secondary format by transforming the primary test data from the primary format into the secondary format by carrying out a transformation of the primary test data from a first coordinate system formed by one or more first coordinates into a second coordinate system formed by one or more second coordinates, the first coordinates differing from the second coordinates;

providing the secondary test data in the secondary format for storing the secondary test data in a plurality of storage units.

* * * * *